United States Patent
Kohn

(10) Patent No.: US 9,648,779 B2
(45) Date of Patent: May 9, 2017

(54) ELECTRONIC APPARATUS, SUCH AS A MODEM OR THE LIKE, COMPRISING A PLURALITY OF AIR-COOLED PROCESSORS

(71) Applicant: SAGEMCOM BROADBAND SAS, Rueil Malmaison (FR)

(72) Inventor: Stephane Kohn, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 14/349,993

(22) PCT Filed: Oct. 30, 2012

(86) PCT No.: PCT/EP2012/071451
§ 371 (c)(1),
(2) Date: Apr. 4, 2014

(87) PCT Pub. No.: WO2013/072180
PCT Pub. Date: May 23, 2013

(65) Prior Publication Data
US 2014/0254097 A1    Sep. 11, 2014

(30) Foreign Application Priority Data

Nov. 18, 2011 (FR) .................... 11 60549

(51) Int. Cl.
*H05K 7/20* (2006.01)
*H05K 5/00* (2006.01)
*H01L 23/467* (2006.01)
*G06F 1/18* (2006.01)
*G06F 1/20* (2006.01)

(52) U.S. Cl.
CPC ......... *H05K 7/20154* (2013.01); *G06F 1/181* (2013.01); *G06F 1/20* (2013.01); *H01L 23/467* (2013.01); *H05K 7/20* (2013.01); *H05K 7/20145* (2013.01); *H01L 2924/0002* (2013.01)

(58) Field of Classification Search
None
See application file for complete search history.

(56) References Cited

U.S. PATENT DOCUMENTS

| 4,103,737 | A | * | 8/1978 | Perkins | H01L 23/467 165/109.1 |
| 5,077,601 | A | * | 12/1991 | Hatada | H01L 23/467 165/80.3 |
| 5,544,012 | A | | 8/1996 | Koike | |
| 5,986,882 | A | | 11/1999 | Ekrot et al. | |
| 6,377,459 | B1 | * | 4/2002 | Gonsalves | H01L 23/427 165/104.33 |

(Continued)

*Primary Examiner* — Courtney Smith
(74) *Attorney, Agent, or Firm* — Muncy, Geissler, Olds & Lowe, P.C.

(57) ABSTRACT

An electronic appliance of modem or analogous type has a fan and an internal casing channeling the air stream generated by the fan, and a plurality of processors fitted with radiators that are mounted in the appliance. The radiators are situated in register with different portions (PS, PI) of the cross-section of the channeled air stream so that the different radiators are cooled by different portions (PS, PI) of the air stream. The appliance applies to the field of home electronics.

5 Claims, 2 Drawing Sheets

(56) References Cited

U.S. PATENT DOCUMENTS

| | | | | |
|---|---|---|---|---|
| 6,888,725 B2* | 5/2005 | Kubo | ........................ | G06F 1/20 |
| | | | | 257/721 |
| 8,472,181 B2* | 6/2013 | Doll | ........................ | G06F 1/20 |
| | | | | 361/679.49 |
| 9,075,581 B2* | 7/2015 | Stock | ........................ | G06F 1/20 |
| 2002/0134531 A1* | 9/2002 | Yanagida | .................. | G06F 1/18 |
| | | | | 165/80.3 |
| 2003/0218850 A1* | 11/2003 | Kubo | ........................ | G06F 1/20 |
| | | | | 361/103 |
| 2006/0087810 A1 | 4/2006 | Rockenfeller | | |
| 2008/0041562 A1* | 2/2008 | Bhatia | ....................... | G06F 1/20 |
| | | | | 165/80.3 |
| 2012/0020013 A1* | 1/2012 | Li | ....................... | H05K 7/20727 |
| | | | | 361/679.47 |
| 2014/0098492 A1* | 4/2014 | Lam | .................. | H05K 7/20727 |
| | | | | 361/692 |

\* cited by examiner

ELECTRONIC APPARATUS, SUCH AS A MODEM OR THE LIKE, COMPRISING A PLURALITY OF AIR-COOLED PROCESSORS

The invention relates in general to optimizing the cooling of an electronic appliance having a plurality of processors.

BACKGROUND OF THE INVENTION

The invention applies in particular to a multimedia appliance such as modem, a decoder, or the like, e.g. a set top box, i.e. an appliance for connection to a DLS type modem and to a TV for converting an audiovisual content signal from the modem into a signal that is usable by a TV for the purpose of displaying the content.

Such an electronic appliance generally incorporates one or more fans for cooling its components by establishing a forced flow of air inside its enclosure.

Because of its function, such an appliance is generally installed close to the TV to which it is connected, so it is necessary for the background noise generated by its cooling fan(s) to be as low as possible, since otherwise its presence significantly disturbs the comfort of a user watching a program on the TV.

It can readily be understood that such an appliance can equally well be connected to a computer, to an audio/video player, to a games console, or to any type of appliance.

OBJECT OF THE INVENTION

The object of the invention is to provide a solution for providing such an electronic appliance with cooling that is both effective and silent.

SUMMARY OF THE INVENTION

To this end, the invention provides an electronic appliance of modem, decoder, or analogous type, comprising a fan and an internal casing channeling the air stream generated by the fan, together with a plurality of integrated circuits such as processors fitted with radiators that are mounted in the appliance so that their radiators are situated in register with different portions of the cross-section of the channeled air stream so that the different radiators are cooled by different portions of the air stream.

With this architecture, the various processors receive air that is at substantially the same temperature, thus enabling all of them to be cooled effectively without any need to having recourse to a plurality of fans.

The invention also provides an appliance as defined above, wherein the radiators of the integrated circuits are spaced apart from one another along the air stream generated by the fan.

The invention also provides an appliance as defined above, including at least two integrated circuits having their radiators oriented in opposite directions.

The invention also provides an appliance as defined above, wherein the casing is of a shape that channels the stream of air from the fan in rectilinear manner.

The invention also provides an appliance as defined above, having two integrated circuits carried by two distinct electronic cards that are superposed and parallel to each other, and wherein the casing is interposed between these two cards and has two parallel side walls situated on either side of the two integrated circuits, and extending perpendicularly to the electronic cards.

The invention also provides an appliance as defined above, wherein the casing has at least one constriction for locally adapting the air flow rate to the radiator of an integrated circuit.

The invention also provides an appliance as defined above, wherein the casing also includes one or more side openings for deflecting a fraction of the air from the fan towards components other than the radiators of the integrated circuits.

DETAILED DESCRIPTION OF THE INVENTION

The idea on which the invention is based is to ensure that various portions of the air stream generated by a given fan cool different processors in such a manner that the various processors receive the cooling air at the same temperature.

In the example of the figures, the invention is applied to an electronic appliance 1 for interposing between a modem and a TV in order to convert signals coming from the modem and make them usable by the TV.

Figure 1:
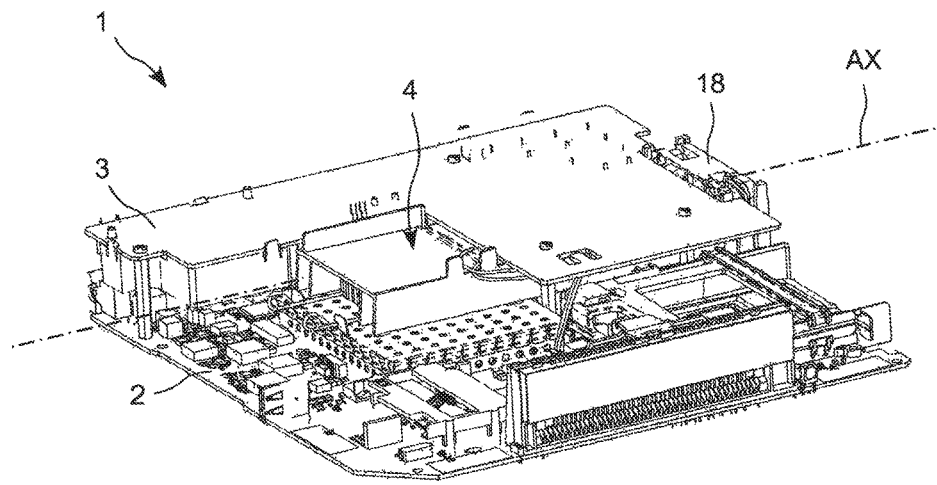
FIG. 1 is a perspective view of various component elements constituting the appliance of the invention.

As can be seen in FIG. 1, the appliance has a main electronic card 2, or bottom card, supporting a secondary electronic card 3, or top card, extending parallel to the main card and spaced apart therefrom, together with a casing 4 that is interposed between the two electronic cards.

The casing is a piece of plastics material of generally elongate shape that extends in a direction corresponding to an axis referenced AX in the figures, which axis is parallel to the cards 2 and 3.

Figure 2:
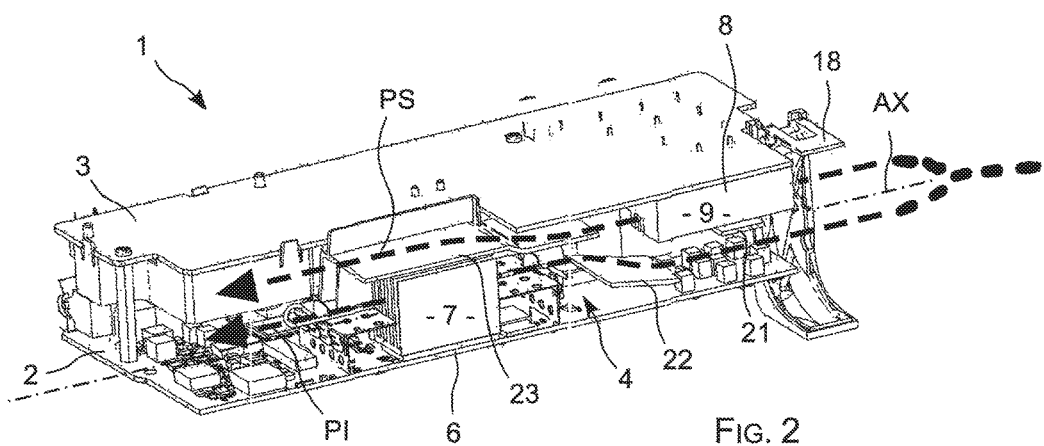
FIG. 2 is a view in perspective and in longitudinal section showing the elements constituting the appliance of the invention on a section plane passing through the casing.

As can be seen in FIG. 2, the cards 2 and 3 carry various components, including in particular a bottom processor 6 with its radiator 7 carried by the main card 2, and a top processor 8 with its radiator 9 carried by the other card, i.e. the card 3 which is situated above the card 2.

Both the radiator 7 and the radiator 9 are aluminum radiators fitted to the outside faces of the processors 6 and 8, respectively, and each of the radiators mainly comprises a series of mutually parallel fins extending in the direction AX and spaced apart from one another transversely relative to the direction AX. These radiators could equally well be of the stud type.

The casing 4 mainly comprises two mutually parallel side walls extending in the direction AX and spaced apart from each other transversely to said direction AX. Each of these walls, referenced 11 and 12 in FIG. 3, extends from the card 2 to the card 3.

The casing 4 extends from a region corresponding to two parallel edges of the electronic cards 2 and 3 where there is an open air admission end 13 of the casing 4, to a central region of the assembly constituted by the two cards 2 and 3 and where there is the air exhaust end 14 of the casing 4.

The two processors 6 and 8 with their respective radiators 7 and 9 are mounted in this assembly in such a manner as to be spaced apart along the axis AX, while being oriented opposite ways round.

Figure 3:
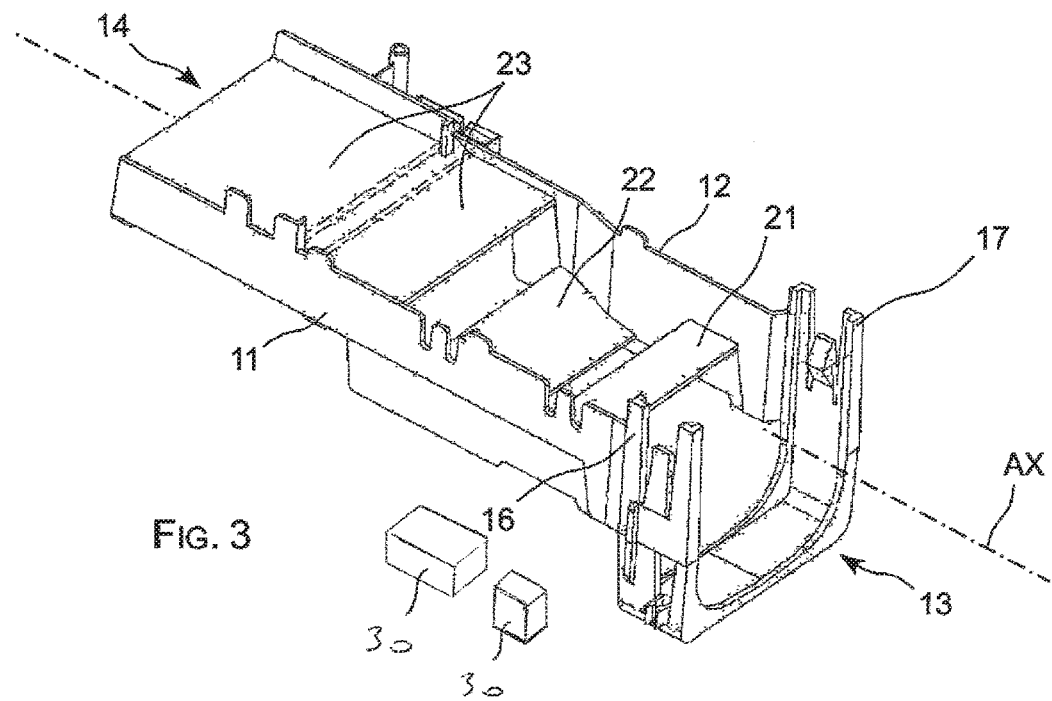
FIG. 3 is a perspective view showing the top portion of the casing on its own.

As can be seen in FIGS. 1 and 3, the bottom processor 6 is carried by the top face of the main card 2, being situated in a central region of the card and being surrounded by the walls 11 and 12 of the casing 4 at its end 14, with its radiator 8 and its fins directed upwards, i.e. towards the bottom face of the secondary card 3.

The top processor 8 is carried by the bottom face of the secondary card 3, being surrounded by the walls 11 and 12, and it is close to the admission end 13. The radiator 9 of this processor 8 has its fins pointing downwards, i.e. towards the top face of the main card 3.

Figure 4:
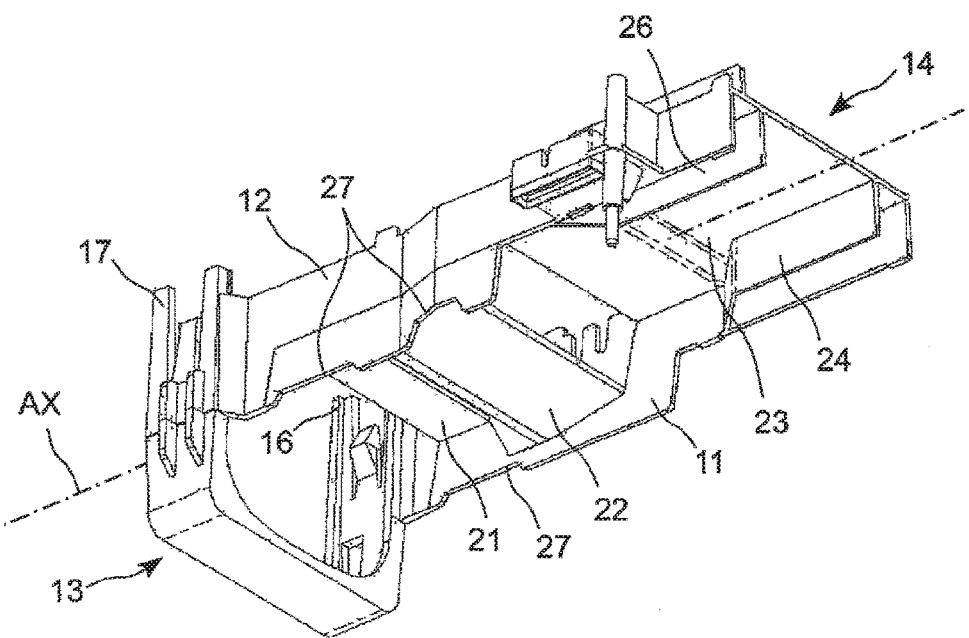
FIG. 4 is a perspective view showing the bottom portion of the casing on its own.

As can be seen in FIGS. 3 and 4, the admission opening or end 13 of the casing 4 is in the form of a cradle designed to receive a fan that is secured by snap-fastening. For this purpose, this end 13 has two parallel arms 16 and 17 each provided with a catch, these two catches pointing towards each other.

Installing the fan, which can be seen in part in FIGS. 1 and 2 where it is referenced 18, thus merely consists in engaging it between the two arms 16 and 17 until it snap-fastens so as to be locked in position by the catches carried by the arms.

As can be seen in the various figures, the casing 4 together with the bottom card 2 and the top card 3 between which it is interposed constitutes an air guide for channeling the air that is admitted by the fan 18 so that it flows along the direction AX, thereby causing the air to cool the processors 6 and 8 effectively.

Given that the processors 6 and 8 are mounted opposite ways round, the bottom processor 6 with its radiator 7 is situated facing a bottom portion of the air stream channeled by the casing 4, while the top processor 8 with its radiator 9 is situated facing a top portion of this air stream. It is also possible to provide an arrangement in which the processors are mounted side by side on a single card, while being cooled by distinct portions of a stream of air driven by the fan 18.

Thus, in operation, i.e. when the fan 18 is activated to suck in outside air and blow it into the guide constituted by the casing 4 towards the extraction end 13 of the casing, the bottom portion of this air stream cools the radiator 7 of the bottom processor 6, while the top portion of this air stream cools the radiator 9 of the top processor 8.

Since the radiators 7 and 9 are cooled by distinct portions of the air stream from the fan 18, each of them receives air at substantially the same temperature, thus enabling both radiators to be cooled with substantially the same effectiveness. In other words, by means of the invention, there is no need to privilege one of the processors over the other in terms of cooling.

As mentioned above and as can be seen in FIGS. 3 and 4, the casing or air guide 4 has two longitudinal walls 11 and 12 that extend vertically relative to the cards 2 and 3 and that are connected together by three portions that are substantially parallel to the cards 2 and 3, these three portions being referenced 21, 22, and 23.

The first of these three portions, referenced 21, is a stiffener bridge connecting together the two walls 11 and 12 in the vicinity of the admission end 13 in order to stiffen the casing mechanically. Since this bridge is substantially in register with the top processor 8, being about halfway up the height of the casing 4, it corresponds substantially to the separation between the top portion of the cooling air stream and the bottom portion of the cooling air stream.

Specifically, the top portion of the cooling air stream from the fan 18 passes over this bridge 21, on passing through the radiator 9 of the second processor 8.

The second of these three portions, referenced 22, is a deflector situated in the bottom region of the guide constituted by the casing 4: this deflector is close to the bottom electronic card 2 carried by the casing 4, while being inclined relative to said card so as to reduce the height of the section of the passage for the air stream progressively as it advances towards the exhaust end 13. The angle of inclination of the deflector 22 thus tends to deflect the stream of cooling air substantially towards the top card 3.

The third portion 23 constitutes an extraction ramp that is situated in the top region of the casing 4, being above the bottom processor 6 and its radiator 7. This ramp 23 slopes a little, in the same direction as the deflector 22, in order to exhaust the top portion of the air stream upwards, i.e. the portion of the stream that has cooled the top processor 8.

In order to further facilitate exhausting the portion of the air stream that has cooled the top processor 8, the secondary or top electronic card 3 is open in register with the bottom processor 6 and its radiator 7, i.e. over the major portion of the extraction ramp 23, thus making it possible for example to extract the cooling air from the top processor 8 directly, e.g. towards an exhaust grid provided for this purpose in the housing (not shown) surrounding the assembly shown in FIG. 1.

In addition, and as shown in particular in FIG. 4, the casing 4 also has two partitions 24 and 26 situated under the ramp 23 and extending parallel to the walls 11 and 12, while being spaced apart therefrom. These two partitions 24 and 26 thus act together to define a constriction in the width of the bottom portion of the air stream, i.e. the portion of the stream of air cooling the radiator 7 of the bottom processor 6.

Thus, it will be understood that the section of the passage for the bottom portion of the air stream, i.e. the portion of the air stream that cools the bottom processor 6, is constricted both vertically by the deflector 22 and also horizontally by the partitions 24 and 26.

In practice, the constrictions in section constituted by the deflector 22 and the partitions 24 and 26 serve to accelerate the bottom portion of the cooling air stream so that it passes through the radiator 7 at a higher speed, thereby improving the air flow rate and consequently improving the efficiency of heat exchange.

In general, the air guide constituted by the casing 4 divides the stream of air produced by the fan 18 into a top portion and a bottom portion, which portions are represented in FIG. 2 by dashed line arrows respectively referenced PS and PI.

The top portion PS, which corresponds in this example substantially to the top half of the air stream produced by the fan 18, passes firstly through the radiator 9 of the top processor 8, while passing over the bridge 21, and is then collected by the ramp 23 in order to be exhausted towards the top portion of the exhaust end 14 of the casing 4.

The bottom portion PI of the stream of air generated by the fan 18 in this example corresponds substantially to the bottom half of this stream. It passes under the radiator 9 running substantially along the bottom face of the bridge 21, prior to being deflected by the sloping deflector 22, which reduces the vertical height of the flow section of the stream in order to accelerate it. The bottom portion PI then passes through the radiator 7 of the bottom processor 6 so as to cool it, it being understood that through this radiator 7, the width of the flow section of this bottom portion PI is reduced by means of the two partitions 24 and 26, thereby enabling its speed to be further increased.

In addition, each of the walls 11 and 12 has setbacks 27 in their bottom edges, i.e. their edges that come into contact with the bottom electronic card 2 when the system is assembled, so as to deflect cooling air out from the casing 4 in order to cool components 30 of the appliance other than the processors 6 and 8.

Specifically, each setback 27 is in the form of an archway or the like constituting a side opening through which the air injected into the guide casing 4 by the fan 18 can pass in order to be directed between the two cards 2 and 3 so as to cool other components.

The casing 4 is secured to the electronic cards 2 and 3 by mechanical mounts making use in particular of various studs, notches, or the like, given reference 28, and that project beyond the top portion and the bottom portion of the casing so as to engage in corresponding housings provided for that purpose in the electronic cards 2 and 3 that sandwich the casing 4 so as to form an air guide.

In the construction shown by way of example in the figures, the air stream generated by the fan 18 is channeled to follow a path in the casing 4 that is rectilinear and in alignment with the processors 6 and 8, such that this air suffers little head loss, thereby making it possible to reduce the amount of noise generated by the cooling, and to increase the effectiveness of the air stream in terms of cooling.

The invention claimed is:

1. An electronic appliance, comprising:
a fan generating an air stream; and
an internal casing channeling the air stream generated by the fan, together with a plurality of integrated circuits such as processors fitted with radiators that are mounted in the appliance so that the respective radiators are situated in register with different portions (PS, PI) of a cross-section of the channeled air stream so that the respective radiators are cooled by the different portions (PS, PI) of the air stream, the different portions of the air stream being separated by the internal casing, the internal casing comprising one or more side openings for deflecting a at least a fraction of one of the separated portions of the air stream from the fan towards components other than the radiators of the integrated circuits.

2. The appliance according to claim 1, wherein the radiators of the integrated circuits are spaced apart from one another along the air stream generated by the fan.

3. The appliance according to claim 1, including at least two integrated circuits having their radiators oriented in opposite directions.

4. The appliance according to claim 1, wherein the plurality of integrated circuits are two integrated circuits carried by two distinct electronic cards that are superposed and parallel to each other, and wherein the casing is interposed between these two cards and has two parallel side walls situated on either side of the two integrated circuits, and extending perpendicularly to the electronic cards.

5. The appliance according to claim 1, wherein the casing has at least one constriction for locally adapting an air flow rate to one of the respective radiators.

* * * * *